United States Patent
Doare et al.

(10) Patent No.: US 9,401,728 B2
(45) Date of Patent: Jul. 26, 2016

(54) TEST SIGNAL GENERATOR FOR SIGMA-DELTA ADC

(71) Applicants: Olivier Vincent Doare, La Salvetat St Gilles (FR); Rex Kenton Hales, Mesa, AZ (US)

(72) Inventors: Olivier Vincent Doare, La Salvetat St Gilles (FR); Rex Kenton Hales, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/714,946

(22) Filed: May 18, 2015

(65) Prior Publication Data

US 2016/0173120 A1   Jun. 16, 2016

(30) Foreign Application Priority Data

Dec. 16, 2014   (WO) .................. PCT/IB2014/003066

(51) Int. Cl.
*H03M 1/10*   (2006.01)
*H03M 3/00*   (2006.01)

(52) U.S. Cl.
CPC ................ *H03M 3/378* (2013.01); *H03M 3/39* (2013.01)

(58) Field of Classification Search
CPC ....... H03M 1/12; H03M 3/378; H03M 3/458; H03M 3/50; H03M 1/109; H03M 1/1071; H03M 7/3006
USPC ......................................... 341/118, 120, 143
See application file for complete search history.

(56) References Cited

U.S. PATENT DOCUMENTS

| | | | |
|---|---|---|---|
| 5,068,657 A | 11/1991 | Tsai | |
| 5,341,135 A | 8/1994 | Pearce | |
| 5,659,312 A * | 8/1997 | Sunter | H03M 1/109 341/120 |
| 5,909,186 A | 6/1999 | Gohringer | |
| 6,184,810 B1 * | 2/2001 | Burns | G06J 1/00 341/118 |
| 6,259,389 B1 * | 7/2001 | McGrath | G06F 17/5036 341/118 |
| 6,449,569 B1 * | 9/2002 | Melanson | H03M 3/378 341/118 |
| 6,907,374 B1 * | 6/2005 | Tsyrganovich | H03M 3/388 702/107 |
| 7,062,401 B1 | 6/2006 | McGrath | |
| 7,271,751 B2 * | 9/2007 | Peterson | H03M 1/1071 324/750.3 |
| 7,327,152 B2 | 2/2008 | Fischer et al. | |
| 7,327,153 B2 | 2/2008 | Weintraub et al. | |

(Continued)

FOREIGN PATENT DOCUMENTS

WO   2006012503   2/2006

OTHER PUBLICATIONS

U.S. Appl. No. 14/714,946, filed May 16, 2015, entitled "Test Signal Generator for Sigma-Delta ADC".

(Continued)

*Primary Examiner* — Linh Nguyen
(74) *Attorney, Agent, or Firm* — Charlene R. Jacobsen

(57) ABSTRACT

The test signal generator generates an analog and digital test signals to test a sigma-delta ADC which has an analog portion succeeded by a digital decimation filter. The test signal generator supplies a first digital test signal having a first particular number of bits N and a first particular bit rate RN corresponding to digital signals occurring after the digital decimation filter. A digital sigma-delta modulator converts the first digital test signal into a second digital test signal having a second particular number of bits M<N thereby corresponding to a digital signal occurring at an input of the digital decimation filter. A DAC converts the second digital test signal into an analog signal, and a filter to filter the analog signal to obtain an analog test signal for testing the analog portion.

19 Claims, 5 Drawing Sheets

(56) References Cited

U.S. PATENT DOCUMENTS

| | | | |
|---|---|---|---|
| 7,428,683 B2 | 9/2008 | Dai et al. | |
| 8,310,385 B2* | 11/2012 | Dasnurkar | H03M 1/1095 341/120 |
| 8,378,865 B2 | 2/2013 | Zhang | |
| 8,830,098 B2* | 9/2014 | Mir | H03M 3/378 341/120 |
| 2007/0176807 A1* | 8/2007 | Mattes | G01R 31/31917 341/118 |
| 2008/0158028 A1* | 7/2008 | Yang | H03M 1/109 341/118 |
| 2010/0328121 A1* | 12/2010 | Hamilton | H03M 3/378 341/120 |
| 2012/0075130 A1* | 3/2012 | Zhang | H03M 1/109 341/120 |
| 2013/0201046 A1* | 8/2013 | Mir | H03M 3/378 341/143 |

OTHER PUBLICATIONS

Cherry, James A., "Continuous-time Delta-Sigma Modulators for High-Speed A/D Conversion: Theory, Practice and Fundamental Performance Limits", Kluwer Academic Publishers, ISBN 0/7923-8625-6, p. 2.

Schreier, Richard et al., "Understanding Delta-Sigma Data Converters", IEEE Press, ISBN 978-0-471-46585-2, p. 415.

Chouba, N. et al., "A BIST Architecture for Sigma Delta ADC Testing Based on embedded NOEB Self-Test and CORDIC Algorithm", 2010 International Conference on Design and Technology of Integrated Systems in Nanoscale Era; Mar. 23-25, 2010; 7 pages.

Hung, S. et al., "A Fully Integrated Built-in Self-Test ΣΔ ADC on a Wireless Test Platform", 2011 IEEE 17th International Mixed-Signals, Sensors and Systems Test Workshop, May 16-18, 2011; pp. 78-81.

Hong, H. et al., "A Fully Integrated Built-In Self-Test Σ-Δ ADC Based on the Modified Controlled Sine-Wave Fitting Procedure", IEEE Transactions on Instrumentation and Measurement, vol. 59, issue 9; Dec. 15, 2009; pp. 2334-2344.

Ong, C. et al., "Self-Testing Second-Order Delta-Sigma Modulators Using Digital Stimulus", Proceedings 20th IEEE VLSI Test Symposium, Jan. 2002; pp. 123-128.

Hung, S. et al., "A Low-Cost Output Response Analyzer for the Built-in-Self-Test ΣΔ Modulator Based on the Controlled Sine Wave Fitting Method", IEEE 2009 Asian Test Symposium; Nov. 23-26, 209; pp. 385-388.

Non-Final Office Action mailed Oct. 6, 2015 for U.S. Appl. No. 14/715,022, 10 pages.

* cited by examiner

TEST SIGNAL GENERATOR FOR SIGMA-DELTA ADC

CROSS REFERENCE TO RELATED APPLICATION(S)

The present application claims priority to International Patent Application No. PCT/IB2014/003066, entitled "TEST SIGNAL GENERATOR FOR SIGMA-DELTA ADC," filed on Dec. 16, 2014, and is related to co-pending U.S. patent application Ser. No. 14/715,022, entitled "A CIRCUIT GENERATING AN ANALOG SIGNAL USING A PART OF A SIGMA-DELTA ADC," filed on May 18, 2015, the entirety of which are herein incorporated by reference.

FIELD OF THE INVENTION

This invention relates to a signal generator for generating an analog test signal and digital test signals to test a sigma-delta analog to digital converter (ADC), to a system comprising the signal generator and the sigma-delta ADC to be tested, to such a system further comprising a further sigma-delta ADC of which a portion is used as part of the signal generator, and to a method of generating the analog and digital test signals.

BACKGROUND OF THE INVENTION

The international application WO2006/012503A2 discloses a BIST (Build In Self Test) scheme for functionality tests of analog circuitry such as frequency response, gain, cut-off frequency, signal-to-noise ratio and linearity measurement. The BIST scheme utilizes a built-in direct digital synthesizer (which in the following is referred to as DDS) as the test pattern generator which can generate various test waveforms such as chirp, ramp, step frequency, two-tone frequencies, sweep frequencies, MSK (Minimum Shift Keying), phase modulation, amplitude modulation, QAM (Quadrature Amplitude Modulation) and other hybrid modulations. A digital to analog converter (DAC) converts the digital test signals into an analog test signal to be supplied to the analog device under test (which in the following is referred to as DUT). The BIST scheme utilizes a multiplier followed by an accumulator as the output response analyser. This prior art is unable to test the digital circuitry of a DUT.

The publication "A BIST Architecture for Sigma Delta ADC testing Based on Embedded NOEB Self-Test and CORDIC Algorithm" of N. Chouba and L. Bouzaida at 2010 International Conference on Design & Technology of Integrated Systems in Nanoscale Era, IEEE Conference Publications 10.1109/DTIS.2010.5487558 (978-1-4244-6340-4/10) discloses a BIST architecture for testing a sigma-delta ADC. The BIST architecture comprises a binary stream generator which generates a 2252 bits periodic binary sinusoidal stimulus to be supplied to the analog input of the sigma-delta ADC to be tested. A CORDIC generates the reference signal to be used by the modified sine wave fitting in comparing the digital output signal of the sigma-delta ADC with the reference signal. Although this prior art generates a digital test signal, still it is not possible to test the digital circuitry of a sigma-delta ADC separate from its analog portion.

SUMMARY OF THE INVENTION

The present invention provides a signal generator for generating an analog test signal and digital test signals to test a sigma-delta ADC, a system comprising the signal generator and the sigma-delta ADC to be tested, such a system further comprising a further sigma-delta ADC of which a portion is used as part of the signal generator, and a method of generating the analog and digital test signals as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

If in the following, for sake of understanding, the circuitry is described in operation, it will be apparent that the respective elements are arranged to perform the functions being described as performed by them.

Figure 1:
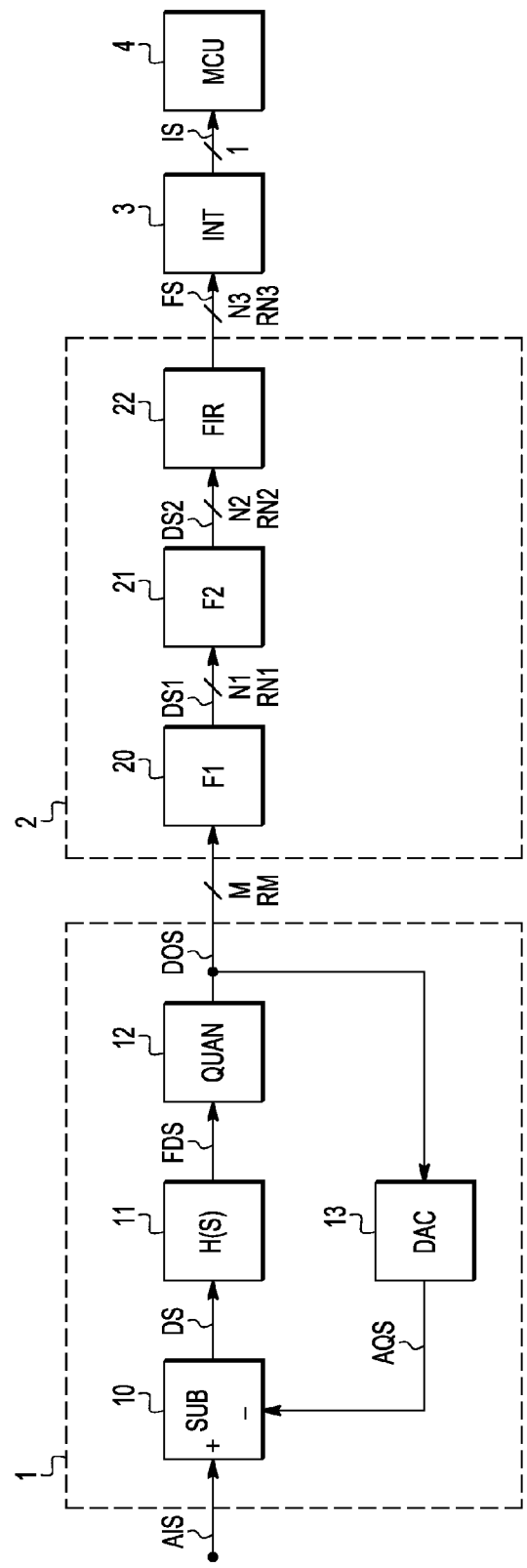
FIG. 1 schematically shows an example of a sigma-delta ADC.

FIG. 1 schematically shows an example of a sigma-delta ADC. The sigma-delta ADC comprises an analog portion 1 and a digital portion 2. The analog portion 1 converts the analog input signal AIS into the digital data stream DOS. The digital portion 2 converts the digital data stream DOS into the digital output signal FS.

The analog portion 1 comprises a subtractor 10, a filter 11, a quantizer 12 and a DAC 13. The subtractor 10 has a non-inverting input to receive the analog input signal AIS and an inverting input to receive the analog quantized signal AQS supplied by the DAC 13. The subtractor 10 supplies the difference signal DS to the filter 11. The filter 11 supplies the filtered difference signal FDS to the quantizer 12 which supplies the digital data stream DOS to the digital portion 2 and to the DAC 13. The subtractor 10 need not be a separate circuit but for example may be a subtraction function performed by opamp(s) of the filter 11.

It is common practice that the filter 11 of the sigma-delta ADC has integrating properties, however that is not mandatory. In general, sigma-delta modulators require some function $H(s)$ to create the transfer function for the ADC. For example, $H(s)$ may be defined as in FIG. 1.2 and equation 1.1 of "Continuous-time Delta-Sigma Modulators for High-Speed A/D Conversion", James Cherry, Martin Snelgrove, Kluwer Academic Publishers, ISBN 0-7923-8625-6, page 2, by $Y(s)=U(s)*(H(s)/(1+H(s)))+E(s)/(1+H(s))$. This equation shows that the signal transfer function $U(s)*(H(s)/(1+H(s)))$ can be separated from the quantization noise transfer function $E(s)/(1+H(s))$. For sufficient large H(s) the result is $Y(s)=U(s)$, independent on what H(s) actually is. An example of a filter 11 which is an integrator is the known CRFF structure as described in "Understanding Delta-Sigma Data Converters"—Richard Schreier, Gabor C. Temes, IEEE Press, ISBN 978-0-471-46585-2, page 415). Such a CRFF structure may comprise a third order continuous time feed forward cascade of resonators, such as three cascaded integrators with a resistor feeding a signal from the output of the second integrator back to the input of the first integrator.

The quantizer 12 may supply the digital data stream DOS as M bit data words wherein M is an integer >=1. The DAC 13 converts the M bit data words into the analog quantized signal AQS. The sample rate of the quantizer 12 and the DAC 13 should at least be higher than two times the highest frequency in the analog input signal AIS. However, in the sigma-delta ADC shown in FIG. 1, to improve performance, the sample rate may be selected higher such that oversampling occurs and decimation by the decimation filters F1 and F2 in the digital portion 2 is possible.

By way of example, the digital portion 2 comprises a first decimation filter 20, a second decimation filter 21 and a FIR (Finite Impulse Response) filter 22. The first decimation filter 20 converts the M bit digital data stream DOS with sample rate RM into a first filtered signal DS1 of which the words have N1>M bits and a sample rate RN1 lower than RM. The second decimation filter 21 converts the N1 bit first filtered signal DS1 with sample rate RN1 into a second filtered signal DS2 of which the words have N2 bits and a sample rate RN2 lower than RN1. The FIR filter 22 converts the second filtered signal DS2 into the digital output signal FS. The FIR filter 22 may be any digital filter such as for example a band-pass filter which supplies the digital output signal FS with a sample rate RN3 of which the words is N3 bits. Alternatively, the FIR filter 22 may combine a band-pass filter and a further decimation filter. Dependent on the application, a single decimation filter may suffice or more than two decimation filters may be implemented. Dependent on the Application any other digital filters may replace a sub-set of the decimation filters or may be part of the decimation filters.

Figure 2:
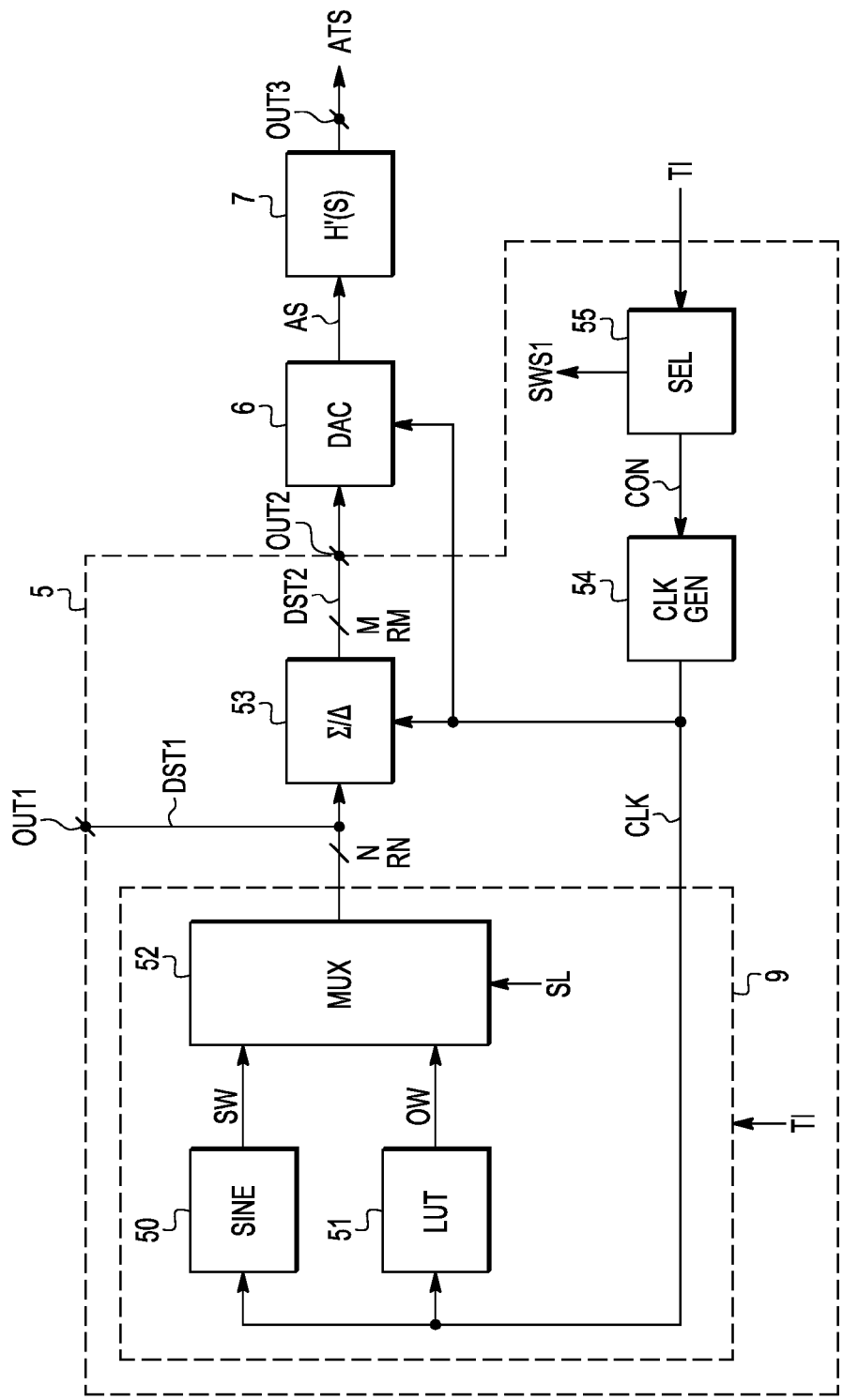
FIG. 2 schematically shows an embodiment of a signal generator which generates analog and digital test signals which may be used to test a sigma-delta ADC, FIG. 3 schematically shows an embodiment of a system which comprises the sigma-delta ADC and the signal generator which uses part of this sigma-delta ADC to generate the test signals, FIG. 4 schematically shows a more detailed block diagram of an embodiment of the signal generator using the filter of a sigma-delta ADC, and FIG. 5 schematically shows a block diagram of two sigma-delta ADC's, a portion of one of the sigma-delta ADC's is used in the signal generator to generate test signals suitable to test the other sigma-delta ADC.

At least two of the M, N1, N2, N3 words have a different number of bits. The signal generator which will be elucidated with respect to FIG. 2 is able to generate these words having the different numbers of bits.

It has to be noted that depending on the application, the digital portion 2 may comprise any number of, even only one, filter selected out of the group of decimation filters and frequency attenuation filters. By way of example, the digital data stream DOS may have a sample rate MR of 240 MSPS at M=5 bits words. It is not mandatory that words are binary coded, or that all the available levels are used. For example the words of the digital data stream DOS may have 17 levels. For example, a thermometer code may be used. Again, by way of example, the digital output signal FS may comprise N3=12 bit words at a sample rate RN3 of 20 MSPS.

The optional interface 3 may convert the N3 bit digital output signal into a serial bit stream IS, for example to be used for further processing by the optional MCU (Micro Controller Unit) 4. Such a further processing may be the calculation of a FFT (Fast Fourier Transform). The conversion of the N3 bit digital output signal FS into a serial bit stream IS may be advantageous if the digital output signal FS has to be available elsewhere in the chip wherein the sigma-delta ADC has been integrated or if the digital output signal FS has to be available outside the chip.

It has to be noted that the sigma-delta ADC shown in FIG. 1 is only an exemplary embodiment. The signal generator in accordance with the invention and described with respect to FIG. 2, may be used for testing any possible architecture of a sigma-delta ADC of which the structure and the signals occurring in the structure are known. The analog test signal generated by the signal generator has to fit the input range of the sigma-delta ADC to be tested. The digital test signals generated by the signal generator have to fit the number of bits and the sample rate of digital signals occurring in the sigma-delta generator to be tested. The signal generator may be integrated in the same chip as the sigma-delta ADC to be tested. Alternatively or additionally, the high quality analog test signal generated by the signal generator may be used to test any other circuit on the same chip or any circuit outside the chip.

FIG. 2 schematically shows an embodiment of a signal generator which generates analog and digital test signals which may be used to test a sigma-delta ADC. The signal generator comprises a digital waveform generator 5, a digital sigma delta modulator 53, a DAC 6, a filter 7, a clock generator 54 and a selection controller 55.

The signal generator generates an analog test signal ATS, a first digital test signal DTS1 and a second digital test signal DTS2 to test a sigma-delta ADC comprising an analog portion 1 for converting an analog input signal AIS into a digital data stream DOS and a digital portion 2 comprising a digital decimation filter 20, 21 for processing the digital data stream DOS into a digital output signal FS, the signal generator comprises: a digital waveform generator 5 arranged for supplying the first digital test signal DTS1 to a first output OUT1 of the signal generator, the first digital test signal DTS1 having a first particular number of bits N and a first particular bit rate RN corresponding to digital signals occurring after the digital decimation filter of the sigma-delta ADC, the digital waveform generator 5 comprises a digital sigma-delta modulator 53 for converting the first digital test signal DTS1 into the second digital test signal DTS2 and for supplying the second digital test signal DTS2 to a second output OUT2 of the signal generator, the second digital test signal DTS 2 having a second particular number of bits M being lower than the first particular number of bits N thereby corresponding to a digital signal occurring at an input of the digital decimation filter of the sigma-delta ADC, a first DAC 6; 17 being coupled to the digital sigma-delta modulator 53 for converting the second digital test signal DTS2 into an analog signal AS, and a first analog filter 7; 15 coupled to the first DAC 6; 17 for filtering the analog signal AS to obtain the analog test signal ATS at a third output OUT3 of the signal generator for testing the analog portion of the sigma-delta ADC.

The digital waveform generator 5 may be of any construction suitable to supply a first digital test signal DTS1 with N bit words and sample rate RN and a second digital test signal DTS1 with M bit words and sample rate RM which may be identical to the sample rate RN. The number of bits N and the associated sample rate RN of the first digital test signal DTS1 can be selected to become equal to either the number of bits and associated sample rate of the filtered signals DS1 and DS2 of the decimation filters 20 and 21 shown in FIGS. 1 and 5, respectively. The number of bits N may be controlled by adapting the amplitude of the digital test signal DTS1, the sample rate RN may be controlled by adapting the clock signal CLK supplied by the clock generator 54 to the digital waveform generator 5. The selection controller 55 supplies the control signal CON and the switch signal SWS1 in response to the test signal select signal TI. The control signal CON controls the frequency of the clock signal CLK. The selection controller 55 is instructed by the test signal select signal TI to output the correct digital test signal matching the number of bits and the sample rate of the digital test signal to be inserted at a desired position into the digital path of the sigma-delta ADC. The operation of the selection controller 55 will be elucidated in more detail with respect to FIG. 5. As will be elucidated with respect to FIG. 3 and in conjunction with the specific embodiment shown in FIG. 1, the first digital test signal DTS1 may be supplied to the input of the decimation filter 21, to the input of the FIR filter 22, or at the output of the FIR filter 22.

In an embodiment, the digital waveform generator 5 may comprise a sine wave generator 50, a LUT (Look Up Table) 51, and a multiplexer 52. The sine wave generator 50 may be based on the CORDIC algorithm known from "A BIST Architecture for Sigma Delta ADC Testing Based on embedded NOEB Self-Test and CORDIC Algorithm, IEEE Conference Publications 10.1109/DTIS.2010.5487558". Alternatively, or additionally, the required digital test signals may be stored in a LUT 51. In the embodiment shown in FIG. 2, the LUT 51 may contain digital data representing ramp or triangular shaped signals, sinusoidal signals, DC levels, any other suitable test signals, or any pre-programmed sequence of such signals and levels. However, such signals may be generated in any other suitable manner without using a LUT. For example, a counter may count clock pulses to obtain a ramp signal. The sine-wave generator 50 supplies the digital sine-wave SW and the LUT 51 supplies the waveform OW to the multiplexer 52 which is controlled via the selection signal SL to output the desired one of these waveforms SW or OW to the sigma-delta modulator 53 of the digital waveform generator 5. The selection signal SL may also be supplied to the LUT 51 to select the desired stored waveform or to the sine wave generator 50 to change the digital sine wave. It has to be noted that the manner in which the digital test signal DTS1 is generated is not important for the invention as long as the number of bits and the sample rate correspond to the number of bits and the sample rate, respectively, of the signal occurring in the sigma-delta ADC under test at the point where the digital test signal DTS1 has to be inserted such that the portion of the sigma-delta ADC from the point of insertion can be tested.

The sigma-delta modulator 53 converts the first digital test signal DTS1 supplied by the multiplexer 52 into a second digital test signal DTS2 which has M<N bit words and a sample rate RM=RN. The number M and the sample rate RM are selected to be equal to the number of bits and the sample rate, respectively, of the digital data stream DOS.

The digital waveform generator 50, 51, 52 and the sigma-delta modulator 53 together are referred to as the digital waveform generator 5 which is able to produce all the digital test signals DTS1, DTS2 which are required to test all the digital blocks of the sigma-delta ADC. The digital waveform test generator 5 supplies the first digital test signal DTS1 at a first output OUT1 and the second digital test signal DTS2 at a second output OUT2.

The DAC 6 and the filter 7 generate the analog test signal ATS which can be used as the analog input signal AIS of the sigma-delta ADC to test its analog portion 1 (see FIG. 1). If the second digital test signal DTS2 has a format (number of bits and sample rate) identical to the format of the digital data stream DOS and the DAC 6 performs the same operation as DAC 13 shown in FIG. 1, the resulting analog signal AS supplied by the DAC will be equal in quality to the analog quantized signal AQS. After filtering the analog signal AS by the filter 7 with transfer function H'(S) at the output OUT3 a high quality analog test signal ATS results which can be used as the analog input signal AIS. As will be elucidated with respect to FIG. 4, the transfer function H'(s) can be obtained by minor modification of the transfer function H(s) of the sigma-delta ADC shown in FIG. 1. Briefly said, the integrating function of H(s) has been changed into a low pass filter function of H'(s). The frequency of the clock signal CLK should be selected to be sufficiently high such that the control of the clock frequency to obtain the different sample rates of the first digital test signal DTS1 will not influence the quality of the analog test signal ATS. Consequently, the embodiment of the test generator as is shown in FIG. 2 is able to efficiently generate all the digital test signals required to test the digital blocks 20, 21, 22 of the sigma-delta ADC under test by changing the clock frequency to obtain the corresponding sample rates and by changing the amplitude of the digital test signals DTS1 and DTS2 to match the number of bits of the digital signals occurring in the sigma-delta ADC under test. The analog test signal ATS is obtained by adding a DAC 6 and a low-pass filter 7. The clock frequency required to obtain the correct sample rates of the digital test signals DTS1 and DTS2 are sufficiently high to perform the digital to analog conversion by the DAC with sufficient high quality because the sample rate of the digital test signal DTS1 is the highest one occurring in the sigma-delta ADC under test.

Thus, the signal generator comprises a clock generator 54 coupled to the digital waveform generator 5 for supplying a clock signal CLK to the digital waveform generator 5, and a controller 55 comprising a controller input for receiving an input control signal TI and being coupled to the clock generator 54 for supplying a clock control signal CON to the clock generator 54 to control a repetition frequency of the clock signal CLK for obtaining the first particular bit rate RN to correspond to a bit rate of a digital signal occurring at an output of the digital decimation filter of the sigma-delta ADC, and to the digital waveform generator 5, wherein the digital waveform generator 5 is arranged for receiving the input control signal TI to obtain the first particular number of bits N to correspond to the number of bits of the digital signal occurring at the output of the digital decimation filter of the sigma-delta ADC. In an embodiment, the digital sigma-delta modulator 53 of the signal generator is arranged for supplying the second digital test signal DTS2 having the second particular number of bits M equal to a quantized signal DOS in the sigma-delta ADC. In an embodiment of the signal generator, the first DAC 6; 17 is a digital to analog converter for converting the quantized signal DOS of a sigma-delta ADC into an analog quantized signal AQS. In an embodiment of the signal generator, the first analog filter 7; 15 is arranged for low-pass filtering of the analog signal AS supplied by the first DAC 6; 17.

Figure 3:
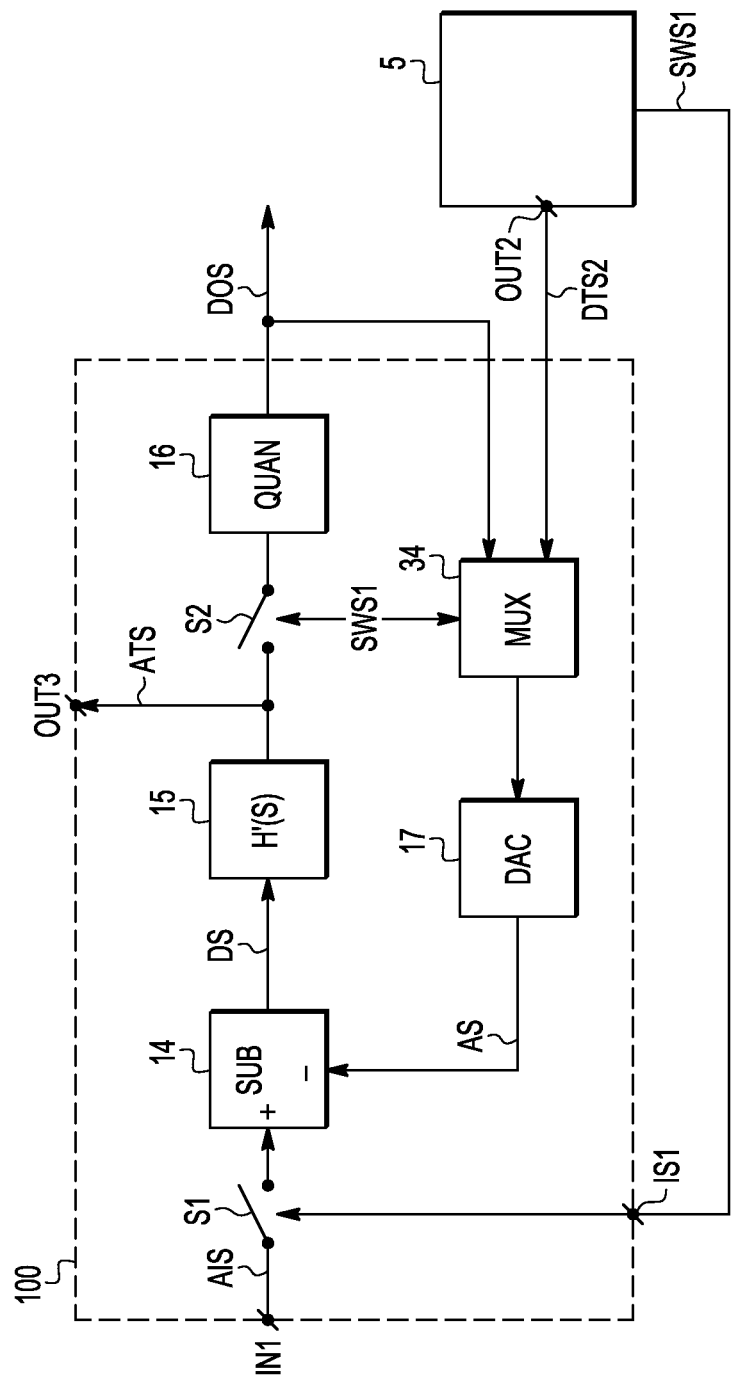

FIG. 3 schematically shows an embodiment of a system which comprises a sigma-delta ADC and the signal generator which uses part of this sigma-delta ADC to generate the test signals.

The system comprises the signal generator and the sigma-delta ADC to be tested, wherein the analog portion 101 of the sigma-delta ADC to be tested comprises: an input for receiving the analog input signal AIS1, a subtractor 10 coupled to the input and to an output of a second DAC 13 for subtracting an analog quantized signal AQS1 supplied by the second DAC 13 from the analog input signal AIS1 to obtain an analog difference signal DS11, a second analog filter 11 coupled to the subtractor 10 for filtering the analog difference signal DS11 into a filtered difference signal FDS1, a second quantizer 12 being coupled to the second analog filter 11 for receiving the filtered difference signal FDS1 and coupled to the second DAC 13 for supplying a quantized signal being the digital data stream DOS1 to the second DAC 13, and the second DAC13 being arranged to convert the digital data stream DOS1 into the analog quantized signal AQS1.

In an embodiment, in the system, the sigma-delta ADC to be tested further comprises a first switch S3 being arranged for coupling the analog input signal AIS1 to the subtractor 10 in a normal mode wherein the sigma-delta ADC to be tested is arranged for converting the analog input signal AIS1 into the digital data stream DOS1, or for coupling the analog test signal ATS to the subtractor 10 in a test mode wherein the sigma-delta ADC to be tested is tested.

In an embodiment, in the system, the digital waveform generator 9 is arranged for obtaining the second particular number of bits M to correspond to the number of bits of the digital data stream DOS1.

In an embodiment, in the system a, the digital portion 2 of the sigma-delta ADC to be tested comprises a first decimation filter 20 coupled for receiving the digital data stream DOS1 to supply a first decimated digital data stream DS1, and wherein the controller 55 is arranged for controlling the clock generator 54 to supply a repetition frequency of the clock signal CLK for obtaining the first particular bit rate RN corresponding to a bit rate of the first decimated digital data stream DS1, and for controlling the digital waveform generator 5 to obain the first particular number of bits N corresponding to the number of bits of the first decimated digital data stream DS1.

In an embodiment, in the system, the digital portion 2 of the sigma-delta ADC to be tested comprises a first multiplexer 35 coupled to the second quantizer 12, the digital waveform generator 5 and the first decimation filter 20 for transferring the digital data stream DOS1 to the first decimation filter 20 when in normal mode and for transferring the first digital test signal DTS1 to the first decimation filter 20 when in test mode.

In an embodiment, in the system, the digital portion 2 of the sigma-delta ADC to be tested further comprises a second decimation filter 21 arranged for converting the first decimated digital data stream DS1 into a second decimated bit stream DS2 and wherein the controller 55 is arranged for controlling the clock generator 54 to supply a repetition frequency of the clock signal CLK for obtaining the first particular bit rate RN corresponding to a bit rate of the second decimated digital data stream DS2, and for controlling the digital waveform generator 5 to obtain the first particular number of bits N corresponding to the number of bits of the second decimated digital data stream DS2.

In an embodiment, in the system, the digital portion 2 of the sigma-delta ADC to be tested comprises a second multiplexer 36 coupled to the first decimation filter 20, the digital waveform generator 5 and the second decimation filter 21 for transferring the first decimated bit stream DS1 to the second decimation filter 21 when in normal mode and for transferring the first digital test signal DTS1 to the second decimation filter 21 when in test mode.

In an embodiment, in the system, the digital portion 2 of the sigma-delta ADC to be tested comprises: at least one decimation filter 20; 20, 21 coupled for receiving the digital data stream DOS1 to supply an output decimated digital data stream DS1; DS2, and a digital filter 22 being arranged for receiving the output decimated digital data stream DS1; DS2 to supply the digital output signal FS. Depending on the application, any type of digital filter could be implemented instead of or in combination with the FIR filter.

In an embodiment, in the system, the digital portion 2 of the sigma-delta ADC to be tested further comprises a third mul-tiplexer 37 arranged for transferring to the digital filter 22 either the output decimated bit stream DS1; DS2 when in normal mode, or the first digital test signal DTS1 when in test mode.

The digital waveform generator 5, which may be identical to the one shown in FIG. 2, supplies the second digital test signal DTS2 and a first switch control signal SWS1. The first switch control signal SWS1 indicates whether the analog portion 100 of the sigma-delta ADC has to operate in the normal mode wherein it acts as an analog to digital converter or in the generator mode wherein parts of the analog portion 100 are used together with the digital waveform generator 5 to generate the analog test signal ATS.

The blocks shown within the dashed block 100 are based on the analog portion 1 of the sigma-delta ADC as is shown in FIG. 1. The subtractor 14 is the subtractor 10 and the quantizer 16 is the quantizer 12 shown in FIG. 1. The filter 11 in FIG. 1 which has the transfer function H(s) has been changed into the filter 15 which has the transfer function H'(s). The DAC 13 shown in FIG. 1 is now the DAC 17.

The multiplexer 34 has been added to supply the digital data stream DOS to the DAC 17 when in normal mode or the second digital test signal DTS2 when in the generator mode. The switch 51 may be added to disconnect the non-inverting input of the subtractor 14 from the analog input signal AIS when in the generator mode such that the the analog difference signal DS supplied to the filter 15 is the inverted output signal of the DAC 17. The filter 15 supplies the analog test signal ATS at output OUT3. The switch S2 may be added to disconnect the quantizer 16 from the output of the filter 15 to prevent the digital data stream DOS from disturbing the analog signal at the output out3. This approach, of re-using building blocks of a sigma-delta ADC to obtain the analog test signal ATS having the correct properties to be used as an analog input signal of another sigma-delta ADC to be tested, may be used on chips which comprise a plurality of sigma-delta ADC's. In an embodiment, the circuits on the chip are arranged such that the DAC, subtractor and filter of at least two of the sigma-delta ADC's can be used to generate the analog test signal ATS. In this manner, the analog test signal ATS may be supplied by another one of the sigma-delta ADC's to the input of the sigma-delta ADC's to be tested. Or said differently, if the DAC, subtractor and filter of at least two of the plurality of the sigma-delta ADC's can be used together with the digital waveform test generator 5 to generate the analog test signal ATS, all the sigma-delta ADC's can be tested one by one or in groups using this analog test signal ATS.

Figure 4:
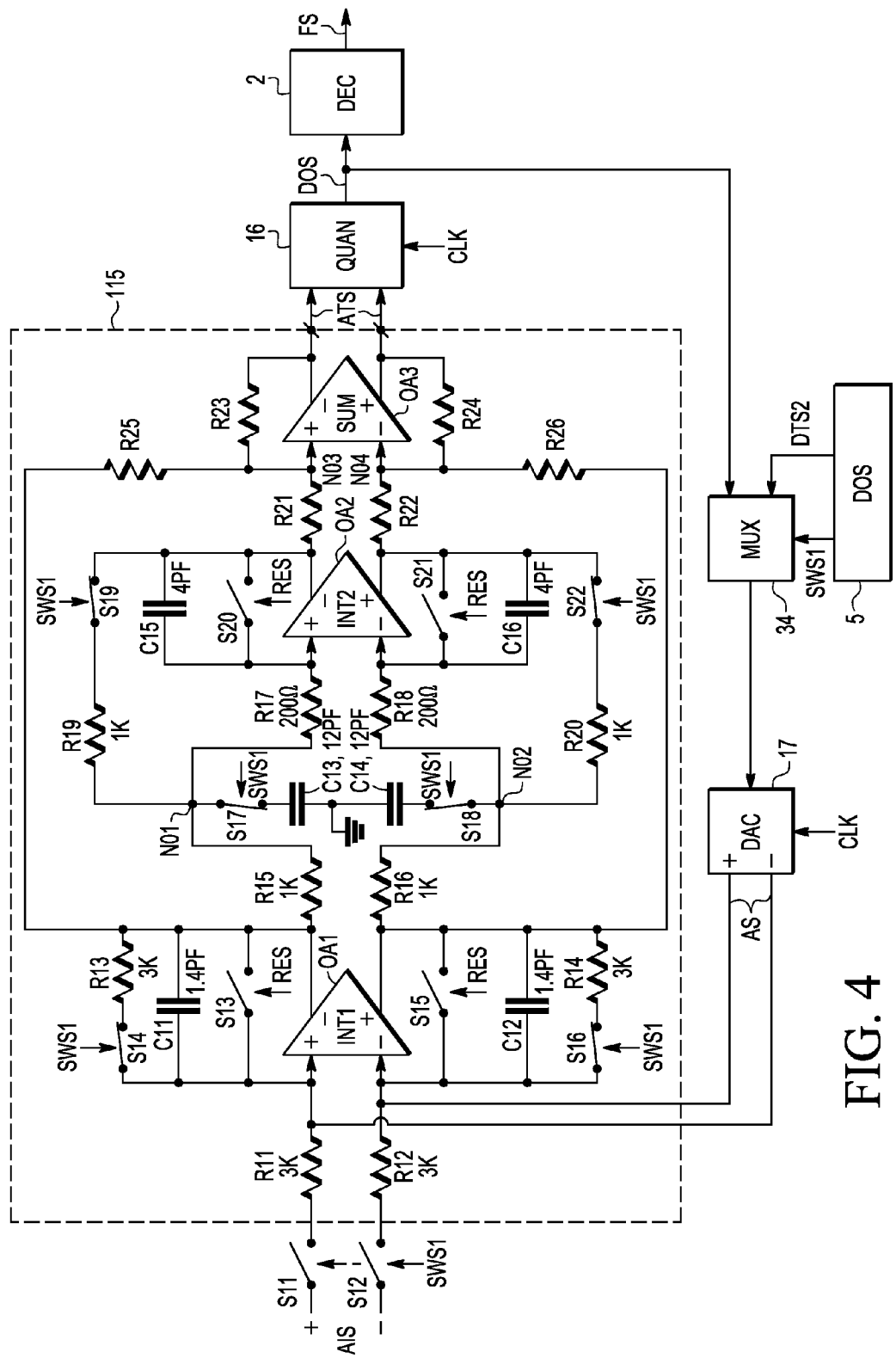

FIG. 4 schematically shows a more detailed block diagram of an embodiment of the signal generator using the filter of a sigma-delta ADC. In the embodiment shown in FIG. 4, the digital waveform generator 5, the multiplexer 34, the DAC 17 and the quantizer 16 correspond to the same numbered blocks shown in FIG. 3. By way of example only, the signal lines are now doubled because differential signals are used. The switch S1 of FIG. 3 has been replaced by the two switches S11 and S12. The subtractor 14 of FIG. 3 has been omitted because the first opamp OA1 of the filter 115 also acts as an adder/subtractor.

Only the construction and operation of the filter 115 will be elucidated with respect to FIG. 4. All the other blocks have the same function as the corresponding blocks shown in and described with respect to FIGS. 1, 2 and 3. The filter 115 is the filter 11 of FIG. 1 with transfer function H(s) when in normal mode. The filter 115 is the filter 7 of FIG. 2 or the filter 15 of FIG. 3 when in generator mode. The switch signal SWS1 indicates whether the sigma-delta ADC is in normal mode or in generator mode. All the switches S11, S12, S14, S16, S17, S18, S19, S22 which are controlled by the switch signal SWS1 are shown in the position they have during the generator mode. The switches S13, S14, S20, S21 which are controlled by the reset signal RES are all in the position when the reset in inactive. The reset may be activated at a switch over from normal mode to generator mode or the other way around to speed up this transition by removing the charge on the integrator capacitors C11, C12, C15, C16. This removes the "history" of what went on when the circuit was in the other mode and thereby improves the performance.

The non-inverting input of the first opamp OA1 receives the analog input signal AIS via the switch S11 and the resistor R11 and is coupled to the inverting output of the DAC 17. The inverting input of the first opamp OA1 receives the analog input signal AIS via the switch S12 and the resistor R12, and is coupled to the non-inverting output of the DAC 17. The DAC 17 supplies the analog signal AS between its non-inverting and inverting outputs. In the embodiment shown, the DAC 17 supplies the analog signal AS as output currents which are converted into a differential input voltage of the opamp OA by the resistors R13 and R14. If the DAC 17 supplies the analog signal AS as output voltages, extra series resistors (not shown) may be required.

A parallel arrangement of a switch S13, a capacitor C11, and a series arrangement of the switch S14 and the resistor R13 are arranged between the non-inverting input and the inverting output of the opamp OA1. A parallel arrangement of a switch S15, a capacitor C12, and a series arrangement of the switch S16 and the resistor R14 are arranged between the inverting input and the non-inverting output of the opamp OA1. In normal mode, the switches S14 and S16 are open and the opamp OA1 with its associated components operates as an integrator.

In generator mode, the switches S14 and S16 are closed to obtain a low pass filter. In an embodiment, by way of example only, in the generator mode, the low pass filter has unity gain and a 3 dB bandwidth of about 37 MHz with a roll off of 20 dB per decade.

A resistor R15 is arranged between the inverting output of the opamp OA1 and a node N01. A resistor R16 is arranged between the non-inverting output of the opamp OA1 and a node NO2. A series arrangement of a switch S17 and a capacitor C13 is arranged between the node NO1 and a reference voltage. A series arrangement of a switch S18 and a capacitor C14 is arranged between the node NO2 and the reference voltage. The non-inverting input of the opamp OA2 receives the signal at the node NO1 via the resistor R17. The inverting input of the opamp OA2 receives the signal at the node NO2 via the resistor R18.

A parallel arrangement of a switch S20 and a capacitor C15 is arranged between the non-inverting input of the opamp OA2 and the inverting output of the opamp OA2. A series arrangement of the switch S19 and the resistor R19 is arranged between the inverting output of the opamp OA2 and the node N01. A parallel arrangement of a switch S21 and a capacitor C16 is arranged between the inverting input of opamp OA2 and the non-inverting output of the opamp OA2. A series arrangement of the switch S20 and the resistor R20 is arranged between the non-inverting output of the opamp OA2 and the node NO2.

In normal mode, when the switches S17, S18, S19, S20 are open, the opamp OA2 with the associated components acts as an integrator. In generator mode, when the switches S17, S18, S19, S22 are closed, a multi-feedback low-pass filter with unity DC-gain is obtained. This provides a two pole or −40 dB per decade amplitude response. The combination of the two amplifiers provides three poles with minimal additions relative to the two integrators in normal mode. The indicated values of the components are by way of example only and will depend on the actual application.

A resistor R21 is arranged between the inverting output of the opamp OA2 and a node NO3. A resistor R22 is arranged between the non-inverting output of the opamp OA2 and a node NO4. A resistor R23 is arranged between the inverting output of the third opamp OA3 and the node NO3. A resistor R24 is arranged between the non-inverting output of the opamp OA3 and the node NO4. The resistor R25 is arranged between the node NO3 and the inverting output of the opamp OA1. The resistor R26 is arranged between the node NO4 and the non-inverting output of the opamp OA1. The opamp OA3 with its associated components acts as a summing amplifier which may have unity gain and then acts as a buffer.

The analog test signal ATS is supplied between the inverting and non-inverting outputs of the opamp OA3 to the quantizer 16. The quantizer 16 supplies the digital data stream DOS to the digital filters 2 and to the multiplexer 34. In normal mode, the multiplexer 34 feeds the output signal of the quantizer 16 to the input of the DAC 17. In generator mode, the multiplexer 34 supplies the digital test signal DTS2 to the DAC 17.

In an embodiment, the switches S11, S12, S14, S16, S17, S18, S19, S22 may be semiconductor switches. Closed switches may be obtained by a conductive transistor, open switches may be obtained by non-conductive transistors or a floating state of a tri-state output. Although in FIG. 4 a second order system has been shown using the two opamps OA1 and OA2 for simplicity, any higher order systems with more than two opamps acting as integrators in normal mode and as low-pass filters in generator mode may be implemented. Alternatively, depending on the application, a first order system may suffice. In an embodiment, further components and switches may be added to the summing amplifier using opamp OA3 which change the summing topology into a combined summing and low-pass operation during the generator mode.

The bandwidth of the low-pass filters, their roll off and the amplification factor depend on the application envisaged and can be found by calculation, simulation or experimentation. Although a feed forward system is shown, alternatively a feedback topology could be implemented to obtain the same transfer function H'(s). Thus, the embodiment of the combination of the transfer functions H(s) and H'(s) shown in FIG. 4 should be considered to be an example only of how in an efficient manner the transfer function H'(s) can be obtained by slightly modifying the already present filter 11 with transfer function H(s). However, any topology which in the normal mode provides the transfer function H(s) and in the generator mode the transfer function H'(s) could be implemented. It is very efficient with respect to the chip area to re-use the already present filter transfer function H(s) in the sigma-delta ADC. Further, such a filter which has already the high quality to be used in the sigma-delta ADC will when reused in slightly different form for the generation of the analog test signal ATS provide a high quality analog test signal.

Alternatively, as discussed hereinbefore the transfer function H(s) need not be obtained by using integrator(s). Thus, in an embodiment, the transfer function H(s) may be realized by using low pass filter(s) which may be identical to the ones used in the transfer function H'(s) such that the transfer functions H'(s) and H(s) and their realisation are identical.

The number of bits of the digital data stream DOS is not indicated In FIG. 4. The actual number of bits and the coding used is not relevant to the invention. In an embodiment, the quantizer may supply 16 thermometer coded bits to represent 17 levels. These thermometer coded bits may also be forwarded by the multiplexer 34 to be processed by the DAC 17. If required for other digital blocks, the thermometer coded bits may be converted by a binary encoder into any suitable binary representation, such as for example, a 5 bit 2's-complement representation.

Figure 5:
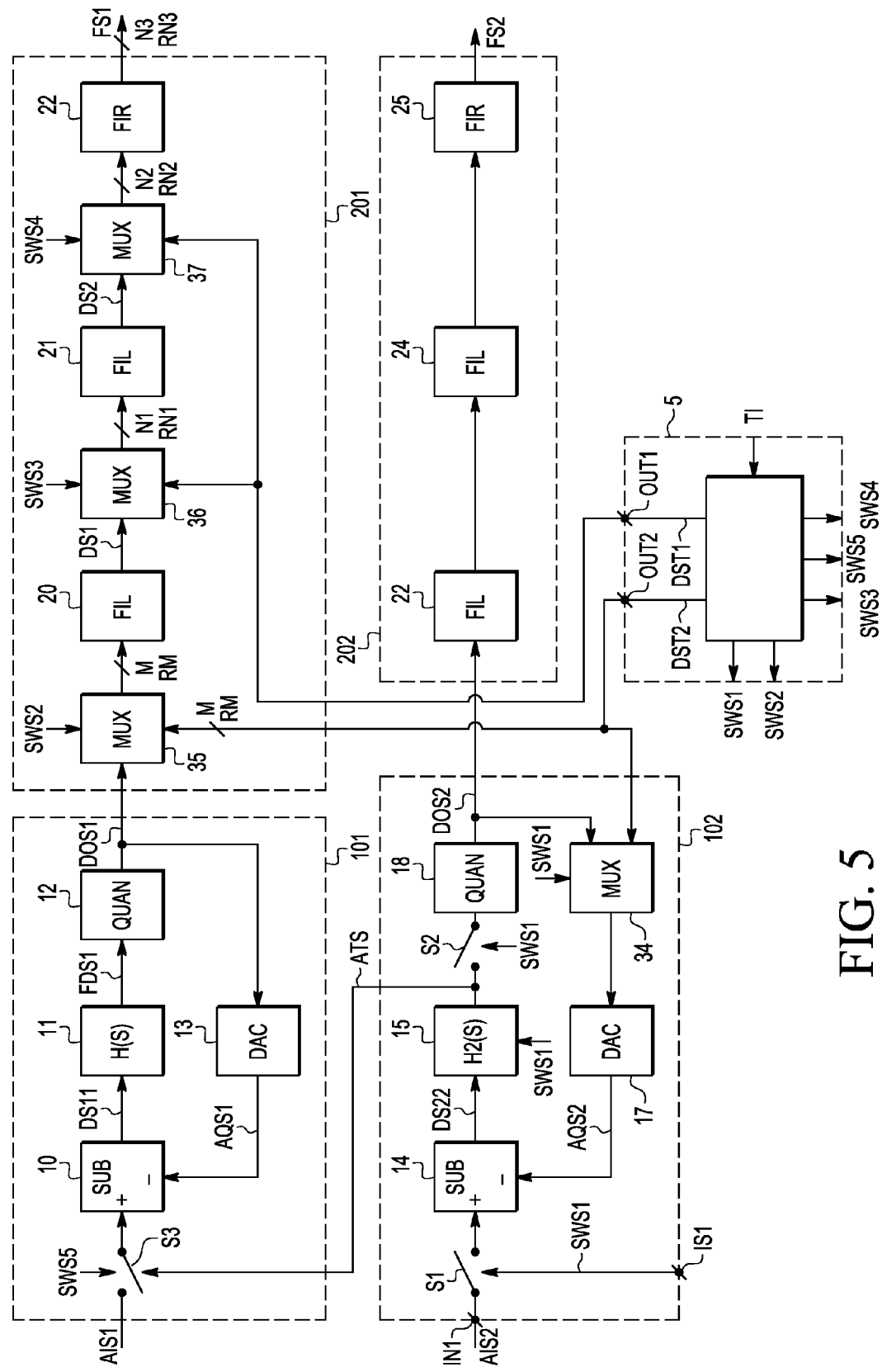

FIG. 5 schematically shows a block diagram of two sigma-delta ADC's, a portion of one of the sigma-delta ADC's is used in the signal generator to generate test signals suitable to test the other sigma-delta ADC.

In an embodiment, the system further comprises a further sigma-delta ADC 102 of which a portion is used as part of the signal generator, the further sigma-delta ADC comprises a further input for receiving a further analog input signal AIS2, a further subtractor 14 coupled to the further input and to an output of a further DAC 17 for subtracting a further analog quantized signal AQS2 supplied by the further DAC 17 from the further analog input signal AIS2 to obtain a further analog difference signal DS22, a further analog filter 15 coupled to the further subtractor 14 for filtering the further analog difference signal DS22 into a further filtered difference signal FDS2, a further quantizer 16 coupled to the further analog filter 15 for receiving the further filtered difference signal FDS2 and coupled to the further DAC 17 for supplying a further quantized signal being the further digital data stream DOS2 to the further DAC 17, and the further DAC17 being arranged to convert the further quantized signal DOS2 into the further analog quantized signal AQS2, wherein the further analog filter 15 comprises the first analog filter 7 or 15 and the further DAC 17 is the first DAC 6 or 17.

In an embodiment, in the system, the controller 55 is arranged for supplying a first switch signal SWS1 in response to the control signal TI, the first switch signal SWS1 indicates whether the further sigma-delta ADC 102 is in its normal mode wherein the further sigma-delta ADC 102 converts the further analog input signal AIS2 into the further digital data stream DOS2 or in a generator mode wherein the portion of the further sigma-delta ADC 102 is used as part of the signal generator.

In an embodiment, in the system, the further analog filter 15 comprises the first analog filter 7 being coupled to the controller 55 for receiving the first switch signal SWS 1 and being arranged for filtering the further analog difference signal DS22, wherein a transfer function of the further analog filter 15 is switchable between on the one hand an integrating function when the first switch signal SWS1 indicates that the further sigma-delta ADC 102 is in its normal mode and on the other hand a low-pass filter function when the first switch signal SWS1 indicates that the further sigma-delta ADC 102 is in its generator mode.

In an embodiment, the system further comprises a second switch S1, wherein the further subtractor 14 is coupled to the further input via the second switch S1, the second switch S1 being arranged for disconnecting the further subtractor 14 from the further input when the first switch signal SWS1 indicates the generator mode thereby coupling the further analog quantized signal AQS2 at the output of the further DAC 17 to the further analog filter 15.

In an embodiment, in the system, the further sigma-delta ADC comprises: the further input for receiving the further analog input signal AIS2 to be converted by the sigma-delta ADC 102 into a further digital data stream DOS2 when the first switch signal SWS1 indicates that the further sigma-delta ADC is in its normal mode, a further switch S2 and a further multiplexer 34, the further quantizer 16 having a quantizer input coupled to the first analog filter 15 via the further switch (S2) and a quantizer output coupled to a first input of the further multiplexer 34, the further switch S2 being arranged for disconnecting the further quantizer 16 from the analog filter 15 when the first switch signal SWS1 indicates that the further sigma-delta ADC 102 is in its generator mode, the further multiplexer 34 has a second input for receiving the second digital test signal DTS2, a selection input for receiving the first switch signal SWS1 and an output coupled to the further DAC 17 for supplying the second digital test signal DTS2 to the further DAC 17 when the first switch signal SWS1 indicates the generator mode and for coupling the quantizer output to the further DAC 17 when the first switch signal SWS1 indicates the normal mode.

The sigma-delta ADC, which comprises the blocks 101 and 201, is the ADC which has to be tested. This sigma-delta ADC is referred to in the now following as the DUT-ADC (Device Under Test-ADC). The other sigma-delta ADC, which comprises the blocks 102 and 202, is the ADC of which a portion is used to generate the analog test signal ATS. This sigma-delta ADC is referred to in the now following as the G-ADC (Generator-ADC).

The block 101 is the block 1 of FIG. 1 to which the switch S3 has been added such that the input signal to the non-inverting input of the subtractor 10 may be selected to be the analog input signal AIS1 to be digitized in normal mode or the analog test signal ATS generated by the G-ADC. The block 201 is based on block 2 of FIG. 1 to which the multiplexers 35, 36, 37 have been added to be able to insert digital test signals into the digital path of the DUT-ADC. The multiplexer 35 is arranged at the input of the block 201 in front of the filter 20 to be able to select in response to the switch signal SWS2 either the digital data stream DOS1 supplied by the analog block 101 or the digital test signal DTS2 generated by the digital waveform test generator 5 as the input signal for the filter 20. The multiplexer 36 is arranged between the filter 20 and the filter 21 to be able to select in response to the switch select signal SWS3 either the output signal DS1 of the filter 20 or the digital test signal DTS1 as the input signal of the filter 21. The multiplexer 37 is arranged between the filter 21 and the filter 22 to be able to select in response to the switch signal SWS4 either the output signal DS2 of the filter 21 or the digital test signal DTS1 as the input signal of the filter 22. It has to be noted that the digital test signal DTS1 may have a different number of bits N and a different bit rate RN dependent on whether the switch signal SWS3 or SWS4 indicates that the digital test signal DTS1 has to be inserted via multiplexer 36 or 37. In both situations the number of bits N and the bitrate RN of the digital test signal DTS1 should match the number of bits and the bitrate of the signal DS1 or DS2 which in normal operation of the DUT-ADC would be inputted into the respective filter 21 or 22.

The analog block 102 of the G-ADC is based on block 100 of FIG. 3, the only difference is that the filter 15 is controlled by the switch signal SWS1 to have the transfer function H(s) when the G-ADC is in normal mode and to have the transfer function H'(s) when the G-ADC is in the generator mode. The digital block 202 of the G-ADC may be identical to the digital portion 2 of FIG. 1. Alternatively, if the DUT-ADC becomes the G-ADC and the G-ADC becomes the DUT-ADC, the digital block 202 may become identical to the block 201.

The digital waveform test generator 5 receives the test signal select signal TI and supplies the digital test signal DTS1 at the output OUT1, the digital test signal DTS2 at the output OUT2 and the switch signals SWS1, SWS2, SWS3, SWS4, SWS5. The digital waveform test generator 5 may be based on the one shown in FIG. 2 wherein the selection controller 55 now also generates the switch signals SWS2, SWS3, SWS4 and SWS5 in response to the test signal select signal TI. If the G-ADC has to operate in the normal mode: SWS1 should control the switches S1 and S2 to be closed, the multiplexer 34 to select the digital data stream DOS2, and the filter 15 such that its transfer function H2(s) becomes H(s) which has the integrating properties as elucidated with respect to FIG. 4. If, as is drawn in FIG. 5, the G-ADC operates in the generator mode, the switch signal SWS1 controls the switches S1 and S2 to open, the multiplexer 34 to select the digital test signal DTS2 and the filter 15 such that its transfer function H2(s) becomes H'(s) which has the low-pass filter characteristics as explained with respect to FIG. 4.

If the G-ADC is selected to operate in the generator mode, it further has to be indicated by the test signal select signal TI which test signal should be inserted where in the DUT-ADC. If the analog test signal ATS has to be supplied to the input of the DUT-ADC, the switch S3 is controlled by the switch signal SWS 5, to select the analog test signal ATS. The other switch signals SWS2, SWS3 and SWS4 may control the multiplexers 35, 36 and 37, respectively, to select the signals DOS1, DS1 and DS2, respectively. If the digital test signal DTS2 has to be used as the test signal to be inserted before the filter 20, the switch signal SWS2 should instruct the multiplexer 35 to select the digital test signal DTS2 and the switch signals SWS3 and SWS4 should instruct the multiplexers 36 and 37, respectively to select the signals DS1 and DS2, respectively. The switch signal SWS5 is don't care. If the digital test signal DTS1 has to be used as the test signal to be inserted before the filter 21, the switch signal SWS3 should instruct the multiplexer 36 to select the digital test signal DTS1. The switch signal SWS4 should instruct the multiplexer 37 to select the signal DS2. The switch signals SWS5 and SWS2 are don't care. If the digital test signal DTS1 has to be inserted before the FIR filter 37, the switch signal SWS4 should instruct the multiplexer 37 to select the digital test signal DTS1. The switch signals SWS5, SWS2 and SWS3 don't care.

In this manner it is possible to generate with the digital waveform test generator 5 the digital test signals DTS1 and DTS2 which allow to inject a suitable digital test signal at each relevant position in the digital portion 201 of a delta-sigma ADC 101, 102. The analog test signal ATS which is suitable to test the analog part 101 of the delta-sigma ADC can be generated by adding the DAC 17 and a filter 15 with the transfer function H'(s) to the digital waveform test generator 5. In an integrated circuit in which multiple sigma-delta ADC's are present, the DAC 17 and the filter 15 may be part of one of the sigma-delta ADC's which has not to be tested. The filter 15 may be based on the same filter 11 (see FIG. 1) as already used in a sigma-delta ADC to filter the difference signal DS of the analog input signal AIS and the DAC 13 output signal. The filter 15 only has provisions to change its transfer function from an integrating function H(s) into a low-pass function H'(s).

It has to be noted that the sigma-delta ADC if FIG. 5 is an embodiment only. Many alternatives exist to design a sigma-delta ADC. For example, any number 1 of decimation filters may be implemented. The FIR filter may be any digital filter and may additionally have decimation properties. With decimation filter is meant any digital filter which converts words of its digital input signal into words of a digital output signal which have more bits than the words of the digital input signal. The digital portion 201 may comprise shaper filters. Any number of other digital filters than decimation filters may be present in the digital portion 201 and may be interleaved with the decimation filters. One or more of the other digital filters may precede the decimation filters.

In an embodiment, a method of generating an analog test signal ATS and digital test signals DTS1, DTS2 to test a sigma-delta ADC comprising an analog portion 101 for converting an analog input signal AIS into a digital data stream DOS and a digital portion 2 comprising a digital decimation filter 20, 21 for processing the digital data stream DOS into a digital output signal FS, comprises: supplying 9 a first digital test signal DTS1 having a first particular number of bits N and a first particular bit rate RN corresponding to digital signals occurring after the digital decimation filter, converting by a digital sigma-delta modulator 53 the first digital test signal DTS1 into a second digital test signal DTS2 having a second particular number of bits M being lower than the first particular number of bits thereby corresponding to a digital signal occurring at an input of the digital decimation filter, converting 6; 17 the second digital test signal DTS2 into an analog signal AS, and filtering 7; 15 the analog signal AS to obtain the analog test signal ATS for testing the analog portion.

In the foregoing specification, the invention has been described with reference to specific examples of embodiments of the invention. It will, however, be evident that various modifications and changes may be made therein without departing from the scope of the invention as set forth in the appended claims.

For example, a plurality of Continuous Time Sigma-Delta Analog to Digital Converters may be integrated in a single chip without having direct access to the ADC inputs at package pins. The testing of such ADC's may become very difficult without the test signal generator being available on the chip. Even if the test signal generator is present on the chip, it is a challenge to provide test signals which enable testing of the ADC to its full performance. The test signal generator was earlier referred to as the signal generator which comprises the digital waveform generator 9, the digital sigma-delta modulator 53 to generate the digital test signals DTS1 and DTS2 the DAC 6 or 17 together with the analog filter 7 or 15 to generate the analog test signal ATS. The digital waveform generator 9 may be a Direct Digital Synthesizer (DDS). Although the signal generator is suitable to test a sigma-delta ADC it may be used to test other blocks on the chip which are also isolated from the package pins, or even to test other blocks off the chip, such as for example interface blocks. The test generator may be used for production tests, but also for self-test in the system for monitoring functions as is required by safety standards such as ISO26262.

For example, the sigma-delta ADC integrated on the chip may be a multi-bit, third order continuous time sigma-delta modulator with a cascade of resonators.

The high quality test signal with sufficiently high performance specifications is obtained by re-using the high quality DAC 13 and filter 11 already present with the correct performance specification in the sigma-delta ADC. The filter characteristics are changed slightly to change the integrating properties during normal operation of the sigma-delta ADC into low-pass properties when used as the smoothing filter in the test generator. The digital waveform generator 9 has to supply a digital signal to the DAC 13 which has the same format as the digital signal (the digital data stream DOS) at the output of the quantizer 12 of the sigma-delta ADC. In this manner, the quality of the signal at the input and thus the output of the DAC will be at the same high level as in the sigma-delta ADC to be tested. In fact, the digital sigma-delta modulator 53 together with the DAC 6 and the filter 7 recreates the input signal at the input of the subtractor 10. This is the same as if the DAC 6 and filter 7 were used with a digital signal to create a sigma-delta DAC. Such a sigma-delta DAC would have the high performance required and subsequently, the test generator will have the same high performance. In an embodiment wherein the same DAC 6 and filter 7 are used as used in one of the sigma-delta ADC's on the chip the performance of the test generator will be sufficiently high to test the sigma-delta ADC's. If the sigma-delta ADC's on the chip have different performance, the DAC and filter of the ADC with the highest performance is used. In an embodiment wherein the DAC and filter of one of the sigma-delta ADC's is used in the test generator, the extra chip area required for the test generator is relatively small because no extra chip area is required for DAC and only minor additions (a few resistors, capacitors and switches) are required to change the transfer function of the filter from that of integrators (resonators) into low-pass filtering. For example the response of the integrators may be changed into second order multi-feedback low-pass filters. Also the summing amplifier OA3 may become a second order multi-feedback low-pass filter. In this particular implementation, the first integrator around the opamp OA1 may become a single pole filter to improve parasitic loading at critical nodes.

In an embodiment, with very little addition in circuit complexity and component area on the chip it is possible to change a third order sigma-delta ADC into a sigma-delta DAC with 7 poles of filtering. It should be noted that depending on the application any other combination of low-pass filters is possible. The first integrator with opamp OA1 could be changed to also become a multi-feedback filter to create 8 poles.

The quantizer 12 may be a 4 bit flash ADC and the DAC 13 may be a 4 bit current steering DAC. However, alternative the ADC and DAC may be single bit or any other number of bits quantizer and DAC. Other quantizer and DAC implementations may be used.

Because the apparatus implementing the present invention is, for the most part, composed of electronic components and circuits known to those skilled in the art, circuit details have not been explained in any greater extent than that considered necessary, for the understanding and appreciation of the underlying concepts of the present invention and in order not to obfuscate or distract from the teachings of the present invention.

Furthermore, although FIG. 1 and the discussion thereof describe an exemplary signal generator for generating test signals suitable to test a sigma-delta ADC, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between analog and logic blocks are merely illustrative and that alternative embodiments may merge analog or logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, the illustrated elements in each one of the Figures may be located on a single integrated circuit or within a same device. Alternatively, the illustrated elements may include any number of separate integrated circuits or separate devices interconnected with each other. For example, the system shown in FIG. 5 may be located on a same integrated circuit or on a separate integrated circuit within a same package. Or even in separate packages. If the analog test signal ATS and the digital test signals DTS1 and DTS2 are used on another chip, they may be first buffered.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A signal generator for generating an analog test signal, a first digital test signal and a second digital test signal to test a sigma-delta ADC comprising an analog portion for converting an analog input signal into a digital data stream and a digital portion comprising a digital decimation filter for processing the digital data stream into a digital output signal, the signal generator comprises:

a digital waveform generator arranged for supplying the first digital test signal to a first output of the signal generator, the first digital test signal having a first particular number of bits and a first particular bit rate corresponding to digital signals occurring after the digital decimation filter of the sigma-delta ADC, the digital waveform generator comprises a digital sigma-delta modulator coupled for converting the first digital test signal into the second digital test signal and for supplying the second digital test signal to a second output of the signal generator, the second digital test signal having a second particular number of bits being lower than the first particular number of bits thereby corresponding to a digital signal occurring at an input of the digital decimation filter of the sigma-delta ADC, a first DAC being coupled to the digital sigma-delta modulator for converting the second digital test signal into an analog signal, and a first analog filter coupled to the first DAC for filtering the analog signal to obtain the analog test signal at a third output of the signal generator for testing the analog portion of the sigma-delta ADC.

2. The signal generator as claimed in claim 1, further comprising
a clock generator coupled to the digital waveform generator for supplying a clock signal to the digital waveform generator, and
a controller comprising a controller input for receiving an input control signal and being coupled to the clock generator for supplying a clock control signal to the clock generator to control a repetition frequency of the clock signal for obtaining the first particular bit rate to correspond to a bit rate of a digital signal occurring at an output of the digital decimation filter of the sigma-delta ADC and to the digital waveform generator, wherein the digital waveform generator is arranged for receiving the control signal to obtain the first particular number of bits to correspond to the number of bits of the digital signal occurring at the output of the digital decimation filter of the sigma-delta ADC.

3. The signal generator as claimed in claim 1, wherein the digital sigma-delta modulator is arranged for supplying the second digital test signal having the second particular number of bits equal to a quantized signal in the sigma-delta ADC.

4. The signal generator as claimed in claim 1, wherein the first DAC is a digital to analog converter for converting the quantized signal of a sigma-delta ADC into an analog quantized signal.

5. The signal generator as claimed in claim 1, wherein the first analog filter is arranged for low-pass filtering of the analog signal supplied by the first DAC.

6. A system comprising the signal generator as claimed in claim 1 and the sigma-delta ADC to be tested, wherein the analog portion of the sigma-delta ADC to be tested comprises:
an input for receiving the analog input signal,
a subtractor coupled to the input and to an output of a second DAC for subtracting an analog quantized signal supplied by the second DAC from the analog input signal to obtain an analog difference signal,
a second analog filter coupled to the subtractor for filtering the analog difference signal into a filtered difference signal,
a second quantizer coupled to the second analog filter for receiving the filtered difference signal and being coupled to the second DAC for supplying a quantized signal being the digital data stream to the second DAC, and
the second DAC being arranged to convert the digital data stream into the analog quantized signal.

7. The system as claimed in claim 6, wherein the sigma-delta ADC to be tested further comprises a first switch being arranged for coupling the analog input signal to the subtractor in a normal mode wherein the sigma-delta ADC to be tested is arranged for converting the analog input signal into the digital data stream, or for coupling the analog test signal to the subtractor in a test mode wherein the sigma-delta ADC to be tested is tested.

8. The system as claimed in claim 2, wherein the sigma-delta ADC to be tested further comprises a first switch being arranged for coupling the analog input signal to the subtractor in a normal mode wherein the sigma-delta ADC to be tested is arranged for converting the analog input signal into the digital data stream, or for coupling the analog test signal to the subtractor in a test mode wherein the sigma-delta ADC to be tested is tested, and wherein the digital waveform generator is arranged for obtaining the second particular number of bits to correspond to the number of bits of the digital data stream.

9. The system as claimed in claim 2, wherein the sigma-delta ADC to be tested further comprises a first switch being arranged for coupling the analog input signal to the subtractor in a normal mode wherein the sigma-delta ADC to be tested is arranged for converting the analog input signal into the digital data stream, or to coupling the analog test signal to the subtractor in a test mode wherein the sigma-delta ADC to be tested is tested, and wherein the digital portion of the sigma-delta ADC to be tested comprises a first decimation filter coupled for receiving the digital data stream to supply a first decimated digital data stream, and wherein the controller is arranged for controlling the clock generator to supply a repetition frequency of the clock signal for obtaining the first particular bit rate corresponding to a bit rate of the first decimated digital data stream, and for controlling the digital waveform generator to obtain the first particular number of bits corresponding to the number of bits of the first decimated digital data stream.

10. The system as claimed in claim 9, wherein the digital portion of the sigma-delta ADC to be tested comprises a first multiplexer coupled to the second quantizer, the digital waveform generator and the first decimation filter for transferring the digital data stream to the first decimation filter when in normal mode and for transferring the first digital test signal to the first decimation filter when in test mode.

11. The system as claimed in claim 9, wherein the digital portion of the sigma-delta ADC to be tested further comprises a second decimation filter arranged for converting the first decimated digital data stream into a second decimated digital data stream and wherein the controller is arranged for controlling the clock generator to supply a repetition frequency of the clock signal for obtaining the first particular bit rate corresponding to a bit rate of the second decimated digital data stream, and for controlling the digital waveform generator to obtain the first particular number of bits corresponding to the number of bits of the second decimated digital data stream.

12. The system as claimed in claim 11, wherein the digital portion of the sigma-delta ADC to be tested comprises a second multiplexer coupled to the first decimation filter, the digital waveform generator and the second decimation filter 21 for transferring the first decimated digital data stream to the second decimation filter when in normal mode and for transferring the first digital test signal to the second decimation filter when in test mode.

13. The system as claimed in claim 2, wherein the sigma-delta ADC to be tested further comprises a first switch being arranged for coupling the analog input signal to the subtractor in a normal mode wherein the sigma-delta ADC to be tested is arranged for converting the analog input signal into tyre digital data stream, or for coupling the analog test signal to the subtractor in a test mode wherein the sigma-delta ADC to be tested is tested, and wherein the digital portion of the sigma-delta ADC to be tested comprises:
at least one decimation filter coupled for receiving the digital data stream to supply an output decimated digital data stream and
a digital filter being arranged for receiving the output decimated digital data stream to supply the digital output signal.

14. The system as claimed in claim 13, wherein the digital portion 2 of the sigma-delta ADC to be tested further comprises a third multiplexer arranged for transferring to the digital filter either the output decimated bit stream when in normal mode, or the first digital test signal when in test mode.

15. A system as claimed in claim 6, further comprising a further sigma-delta ADC of which a portion is used as part of the signal generator, the further sigma-delta ADC comprises:

a further input for receiving a further analog input signal, a further subtractor coupled to the further input and to an output of a further DAC for subtracting a further analog quantized signal supplied by the further DAC from the further analog input signal to obtain a further analog difference signal, a further analog filter coupled to the further subtractor for filtering the further analog difference signal into a further filtered difference signal, a further quantizer coupled to the further analog filter for receiving the further filtered difference signal and coupled to the further DAC for supplying a further quantized signal being the further digital data stream to the further DAC, and the further DAC being arranged to convert the further quantized signal into the further analog quantized signal, wherein the further analog filter comprises the first analog filter and the further DAC is the first DAC.

16. A system as claimed in claim 15, wherein the further analog filter comprises the first analog filter being coupled to the controller for receiving the first switch signal and being arranged for filtering the further analog difference signal, wherein a transfer function of the further analog filter is switchable between on the one hand an integrating function when the first switch signal indicates that the further sigma-delta ADC is in its normal mode and on the other hand a low-pass filter function when the first switch signal indicates that the further sigma-delta ADC is in its generator mode.

17. A system as claimed in claim 15, further comprising a second switch, wherein the further subtractor is coupled to the further input via the second switch, the second switch being arranged for disconnecting the further subtractor from the further input when the first switch signal indicates the generator mode thereby coupling the further analog quantized signal at the output of the further DAC to the further analog filter.

18. A system as claimed in any one of the claim 15, the further sigma-delta ADC comprises:

the further input for receiving the further analog input signal to be converted by the sigma-delta ADC into a further digital bit stream when the first switch signal indicates that the further sigma-delta ADC is in its normal mode, a further switch and a further multiplexer, the further quantizer having a quantizer input coupled to the first analog filter via the further switch and a quantizer output coupled to a first input of the further multiplexer, the further switch being arranged for disconnecting the further quantizer from the analog filter when the first switch signal indicates that the further sigma-delta ADC is in its generator mode, the further multiplexer has a second input for receiving the second digital test signal, a selection input for receiving the first switch signal and an output coupled to the further DAC for supplying the second digital test signal to the further DAC when the first switch signal indicates the generator mode and for coupling the quantizer output to the further DAC when the first switch signal indicates the normal mode.

19. A method of generating an analog test signal and digital test signals to test a sigma-delta ADC comprising an analog portion for converting an analog input signal into a digital data stream and a digital portion comprising a digital decimation filter for processing the digital data stream into a digital output signal, the method comprises:

supplying a first digital test signal having a first particular number of bits and a first particular bit rate corresponding to digital signals occurring after the digital decimation filter, converting by a digital sigma-delta modulator the first digital test signal into a second digital test signal having a second particular number of bits being lower than the first particular number of bits thereby corresponding to a digital signal occurring at an input of the digital decimation filter, converting the second digital test signal into an analog signal, and filtering the analog signal to obtain the analog test signal for testing the analog portion.

\* \* \* \* \*